United States Patent [19]
Oota

[11] Patent Number: 6,031,980
[45] Date of Patent: Feb. 29, 2000

[54] LAYOUT APPARATUS FOR LSI USING CELL LIBRARY AND METHOD THEREFOR

[75] Inventor: Hiroshi Oota, Tokyo, Japan

[73] Assignee: NEC Corporation, Tokyo, Japan

[21] Appl. No.: 08/865,855

[22] Filed: May 30, 1997

[30] Foreign Application Priority Data

May 30, 1996 [JP] Japan ................................ 8-136699

[51] Int. Cl.$^7$ ................................................ G06F 17/50
[52] U.S. Cl. ............................ 395/500.09; 395/500.19
[58] Field of Search ............................ 364/488–491; 395/500.02–500.19

[56] References Cited

U.S. PATENT DOCUMENTS

| | | | |
|---|---|---|---|
| 4,688,072 | 8/1987 | Heath et al. ............................ | 257/202 |
| 5,031,111 | 7/1991 | Chao et al. ............................ | 395/500.08 |
| 5,349,659 | 9/1994 | Do et al. ............................ | 707/7 |
| 5,365,454 | 11/1994 | Nakagawa et al. ............... | 395/500.09 |
| 5,526,276 | 6/1996 | Cox et al. ............................ | 395/500.18 |
| 5,633,807 | 5/1997 | Fishburn et al. ................... | 395/500.2 |

OTHER PUBLICATIONS

Langmaier ("Technology Mapping", Kluwer Academic Publishers, Dordrecht, Netherlands, pp. 71–86, Jan. 1, 1992).

Liem et al. ("A constructive matching algorithm for cell generator based technology mapping", Proceedings of 1992 IEEE International Symposium on Circuits and Systems, vol. 6, pp. 2965–2968, May 3, 1992).

Bergamaschi ("SKOL: a system for logic synthesis and technology mapping", IEEE Transactions on Computer–Aided Design of Integrated Circuits and Systems, vol. 10, No. 11, pp. 1342–1355, Nov. 1991).

Yu et al. ("Acquiring rules of selecting cells by using neural network", Proceedings of the SPIE—The international Society for Optical Engineering, vol. 1469, No. Pt. 1, pp. 412–417, Jan. 1, 1991).

Rao et al. ("On clustering for maximal regularity extraction", IEEE Transactions on Computer–Aided Design of Integrated Circuits and Systems, vol. 12, No. 8, Aug. 1993, pp. 1198–1208).

G. Pelz et al., "Circuit Comparison by Hierarchical Pattern Matching", ICCAD '91, *IEEE*, pp. 290–293, Jan. 1991.

*Primary Examiner*—Kevin J. Teska
*Assistant Examiner*—Phallaka Kik
*Attorney, Agent, or Firm*—Sughrue, Mion, Zinn, Macpeak & Seas, PLLC

[57] ABSTRACT

A layout apparatus comprises a cluster dividing unit for dividing a semiconductor integrated circuit into clusters; and a cell selecting unit which collates the connection relation of the clusters obtained by the cluster dividing unit with the connection relation of the clusters in the cells stored in the cell library to select a cell with which the connection relation of clusters conform as circuit blocks to form the semiconductor integrated circuit, and combines the circuit blocks to make layout of the semiconductor integrated circuit.

8 Claims, 9 Drawing Sheets

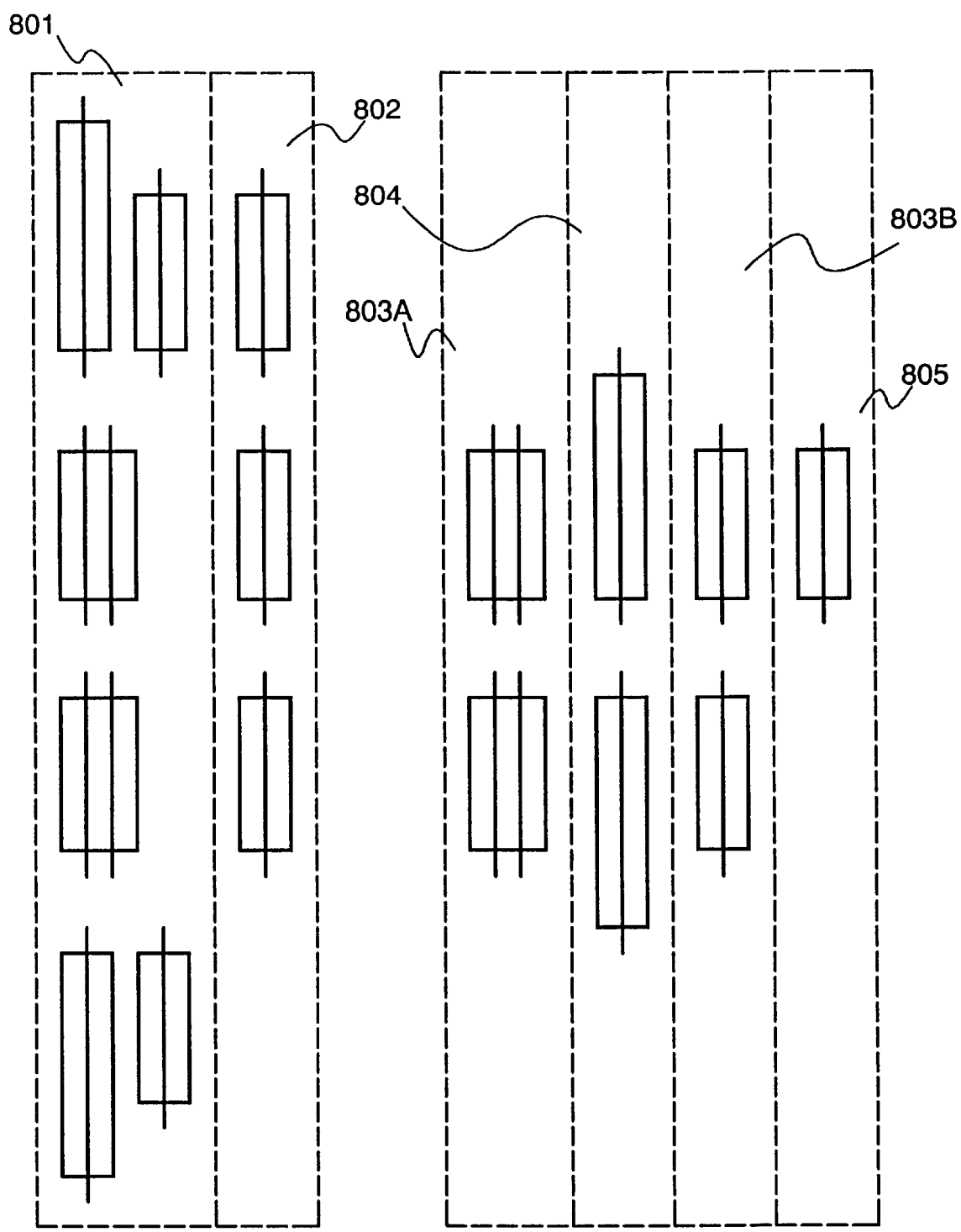

LAYOUT APPARATUS FOR LSI USING CELL LIBRARY AND METHOD THEREFOR

BACKGROUND OF THE INVENTION

1. Field of the Invention

The invention relates to a layout apparatus for a semiconductor integrated circuit (LSI) and a method therefor, and more particularly to a layout apparatus to make layout by collating a circuit represented by clusters with cells stored in a cell library and a method therefor.

2. Description of the Related Art

Improvement of an integration degree of LSIs is outstanding these years, and development costs for preparing a mask pattern are required in a large amount accordingly. Therefore, it is significant to use an automatic mask pattern preparing system.

Conventional automatic LSI producing methods which prepare automatically a mask pattern by entering connection descriptions of a transistor level include the following two methods.

(1) A method of arranging transistors one-dimensionally (single row).

(2) A method of using a layout cell library capable of changing a predefined transistor size.

The method of arranging transistors in a row can form a mask pattern regardless of whatever connection a given connection description has. Specifically, FIG. 7 shows that transistor regions 713 are sequentially arranged on a mask pattern 710 to determine an available region 711. But, when the transistor regions 713 do not have the same size (transistor size), there is a useless region as an unused region 712. Therefore, a signal wiring length becomes long but it is disadvantageous in view of electrical characteristics. Accordingly, this method cannot be used for the LSI which requires predetermined characteristics in a predetermined area.

And, the method which uses a layout cell library is advantageous to reduce an LSI area and to obtain a predetermined performance. But, a perfect mask pattern cannot be formed if a given connection description has a portion which is not defined in the layout cell library. Therefore, to achieve the method using a layout cell library, it is necessary that a given connection description is divided into optimum small blocks, and these small blocks are determined whether they have the same pattern with the cells registered in the layout cell library. This same pattern determining method includes, for example, a method disclosed in "Circuit Comparison by Pattern Matching" given on pp290 to 293 of "ICCAD '91" (IEEE). The method given in this publication compares sequentially the given connection descriptions with predefined connection patterns for each connection hierarchy to recognize the pertinent circuit block.

Generally, it is very significant to reduce the area of a mask pattern in producing an LSI, and it is necessary to suppress an unused region from being formed as much as possible. Therefore, in addition to NAND gates, inverters and other basic gates registered in the layout cell library, it is necessary to register cell patterns which are configured by combining a plurality of them.

But, as shown in FIG. 8, when the connection description of a circuit consisting of an A circuit 801 which comprises a switch (gate) circuit 803A, a half of a switch circuit 803B and a buffer circuit 804 and a B circuit 802 which comprises a half of the switch circuit 803B and an output transistor 805 is compared with the connection pattern, the A circuit 801 and the B circuit 802 cannot be recognized if the switch circuit 803 and the connection pattern are mutually matched in advance. In such a case, a mask pattern using the cell patterns of the circuit 801 and the circuit 802 can be corresponded by two blocks as shown in FIG. 9A, but a mask pattern using the cell patterns of the circuits 803A, 804, 803B and 805 needs four blocks as shown in FIG. 9B. Specifically, the unused region is small when the cell patterns of the A circuit 801 and the B circuit 802 are used. Therefore, the pertinent cell pattern cannot be used, and when the cell patterns of the circuits 803A, 804, 803B and 805 are used, the mask pattern becomes large, and a chip area becomes also large.

As described above, conventional LSI layout technologies cannot apply an appropriate connection pattern depending on a circuit structure and cannot always use the chip area effectively.

SUMMARY OF THE INVENTION

An object of the invention is to provide a layout apparatus which can easily correspond a connection pattern of a complex circuit block to which it could not deal with and which achieves high integration of a semiconductor integrated circuit, and a layout method therefor.

According to the first aspect of the invention, a layout apparatus for making a layout of a semiconductor integrated circuit with the semiconductor integrated circuit indicated by clusters collated with cells stored in a cell library, comprises cluster dividing means for dividing the semiconductor integrated circuit into clusters, cell selecting means for collating a connection relation of the clusters obtained by the cluster dividing means with a connection relation of the clusters in the cells stored in the cell library to select a cell with which the connection relation of clusters conform as circuit blocks to form the semiconductor integrated circuit, and for combining the circuit blocks to make a layout of the semiconductor integrated circuit.

The cell selecting means may collate sequentially the connection relation of the clusters in the semiconductor integrated circuit with the connection relation of the clusters in the cells stored in the cell library to judge identity, and among the clusters forming the semiconductor integrated circuit, determine a cluster having specific conditions or a cluster connected to the output of the collated circuit block as a search start cluster, select all cells containing the same cluster as the search start cluster from the cell library, selects cells containing the cluster connected to the output of the search start cluster from the selected cells, select cells having the connection relation of clusters conforming with the connection relation of clusters in the semiconductor integrated circuit from the selected cells, and extract a cell having the largest number of clusters from the selected cells as the circuit block forming the semiconductor integrated circuit, and make layout of the semiconductor integrated circuit by combining the obtained circuit blocks by repeating the process on all clusters of the semiconductor integrated circuit.

The cluster dividing means may divide the semiconductor integrated circuit with the clusters formed of a group of transistors having mutually connected sources or drains determined as a unit.

In the preferred construction, the cluster dividing means divides the semiconductor integrated circuit with the clusters formed of a group of transistors having mutually connected sources or drains determined as a unit, the said cell selecting means collates sequentially the connection relation of the clusters in the semiconductor integrated circuit with the connection relation of the clusters in the cells stored in the cell library to judge identity, and among the clusters forming the semiconductor integrated circuit, determines a cluster having specific conditions or a cluster connected to the output of the collated circuit block as a search start cluster, selects all cells containing the same cluster as the search start cluster from the cell library, selects cells containing the cluster connected to the output of the search start cluster from the selected cells, selects cells having the connection relation of clusters conforming with the connection relation of clusters in the semiconductor integrated circuit from the selected cells, and extracts a cell having the largest number of clusters from the selected cells as the circuit block forming the semiconductor integrated circuit, and makes layout of the semiconductor integrated circuit by combining the obtained circuit blocks by repeating the process on all clusters of the semiconductor integrated circuit.

According to the second aspect of the invention, a layout method for making layout of a semiconductor integrated circuit by collating the semiconductor indicated by clusters with cells stored in a cell library, comprising the steps of:

dividing the semiconductor integrated circuit into clusters, collating sequentially a connection relation of the clusters in the semiconductor integrated circuit with a connection relation of the clusters in the cells stored in the cell library to judge identity, and among the clusters forming the semiconductor integrated circuit, determining a cluster having specific conditions or a cluster connected to the output of the collated circuit block as a search start cluster, selecting all cells containing the same cluster as the search start cluster determined by the search start cluster decision step from the cell library;

selecting cells containing the cluster connected to the output of the search start cluster from the cells selected in the first cell selecting step;

selecting cells having the connection relation of clusters conforming with the connection relation of clusters in the semiconductor integrated circuit from the cells selected in the second cell selecting step, and extracting a cell having the largest number of clusters from the selected cells as the circuit block forming the semiconductor integrated circuit, and making layout of the semiconductor integrated circuit by combining the obtained circuit blocks by repeating from the search start cluster decision step to the circuit block extraction step on all clusters of the semiconductor integrated circuit.

The cluster dividing step may divide the semiconductor integrated circuit with the clusters formed of a group of transistors having mutually connected sources or drains determined as a unit.

According to the third aspect of the invention, a computer readable memory having a computer program for controlling a layout apparatus which makes layout of a semiconductor integrated circuit by collating the semiconductor integrated circuit indicated by clusters with cells stored in a cell library, said computer program comprising the steps of:

dividing the semiconductor integrated circuit into clusters, collating sequentially a connection relation of the clusters in the semiconductor integrated circuit with a connection relation of the clusters in the cells stored in the cell library to judge identity, and among the clusters forming the semiconductor integrated circuit, determining a cluster having specific conditions or a cluster connected to the output of the collated circuit block as a search start cluster, selecting all cells containing the same cluster as the search start cluster determined by the search start cluster decision step from the cell library, selecting cells containing the cluster connected to the output of the search start cluster from the cells selected in the first cell selecting step, selecting cells having the connection relation of clusters conforming with the connection relation of clusters in the semiconductor integrated circuit from the cells selected in the second cell selecting step, and extracting a cell having the largest number of clusters from the selected cells as the circuit block forming the semiconductor integrated circuit, and making layout of the semiconductor integrated circuit by combining the obtained circuit blocks by repeating from the search start cluster decision step to the circuit block extraction step on all clusters of the semiconductor integrated circuit.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 9A is a layout diagram showing one embodiment of a mask pattern selected by the invention to correspond to the circuit shown in FIG. 8.

FIG. 9B is a layout diagram showing one embodiment of a mask pattern selected by a conventional layout method to correspond to the circuit shown in FIG. 8.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to more clearly show the present invention.

Figure 1:
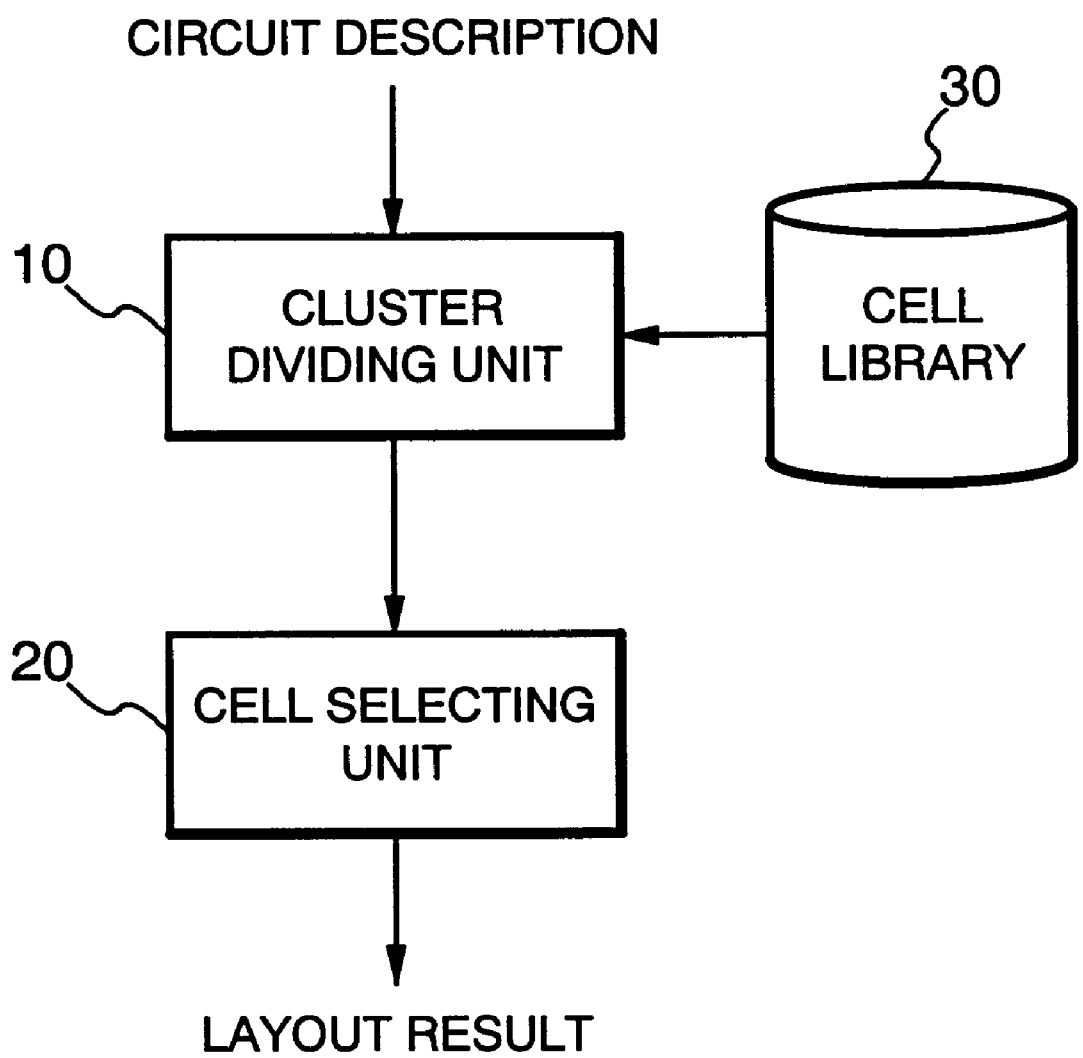
FIG. 1 is a block diagram showing a structure of the layout apparatus according to one embodiment of the invention.

FIG. 1 is a block diagram showing a structure of the layout apparatus for a semiconductor integrated circuit (LSI) according to one embodiment of the invention.

As shown in FIG. 1, the layout apparatus of this embodiment has a cluster dividing unit 10 which receives a connection description of a transistor level in a subject circuit and divides it into clusters and a cell selecting unit 20 which selects a cell corresponding to the subject circuit from a cell library 30 on the basis of the divided clusters. It is to be understood that FIG. 1 shows the characteristic elements of this embodiment and other general elements are omitted.

The cluster dividing unit 10 and the cell selecting unit 20 are achieved by a CPU, RAM and other internal memories controlled by a computer program. The computer program is provided in a state stored in a magnetic disc, a semiconductor memory or another storage medium, and loaded into an internal memory to achieve the cluster dividing unit and the cell selecting unit.

Figure 4:
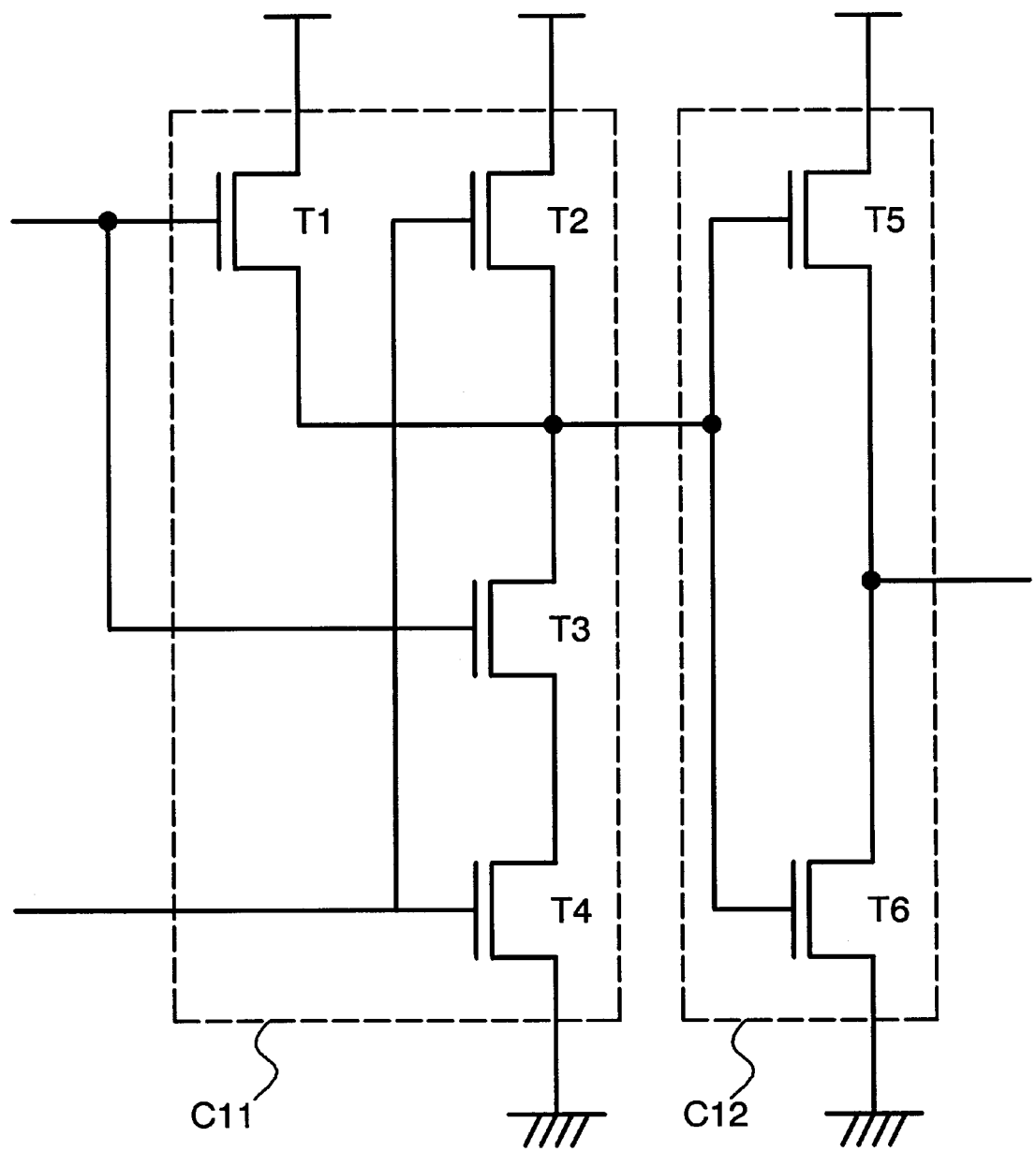
FIG. 4 is a circuit diagram showing a subject circuit divided into clusters.

The cluster dividing unit 10 receives a connection description of the subject circuit and divides it into clusters at a transistor level. The term cluster is used to mean a combination of transistors connected by a source and a drain. The cluster can be obtained by fetching the mutually connected transistors as a bulk after disconnecting from the gate terminal, power supply and ground. And, a transfer gate is regarded as an independent cluster. FIG. 4 shows a circuit which is divided into clusters. The circuit shown in FIG. 4 comprises six transistors T1 to T6; one cluster C11 consists of the transistors T1 to T4, and another cluster C12 consists of the transistors T5 and T6.

The cell selecting unit 20 extracts a small block consisting of some clusters from the subject circuit which is divided into clusters by the cluster dividing unit 10, collates the small block with the cells stored in the cell library 30, and selects cells forming the subject circuit. The collation and selection of cells will be described afterwards.

Operation of this embodiment will be described with reference to the flowcharts of FIG. 2 and FIG. 3.

First, the cluster dividing unit 10 receives a connection description of a subject circuit, divides the cells stored in the cell library 30 and the subject circuit into clusters, and stores them into a storage region (cluster pool) (step 201). The cells are divided into clusters together with the subject circuit, but the cell pattern previously described in clusters may be stored in the cell library 30.

Figure 5:
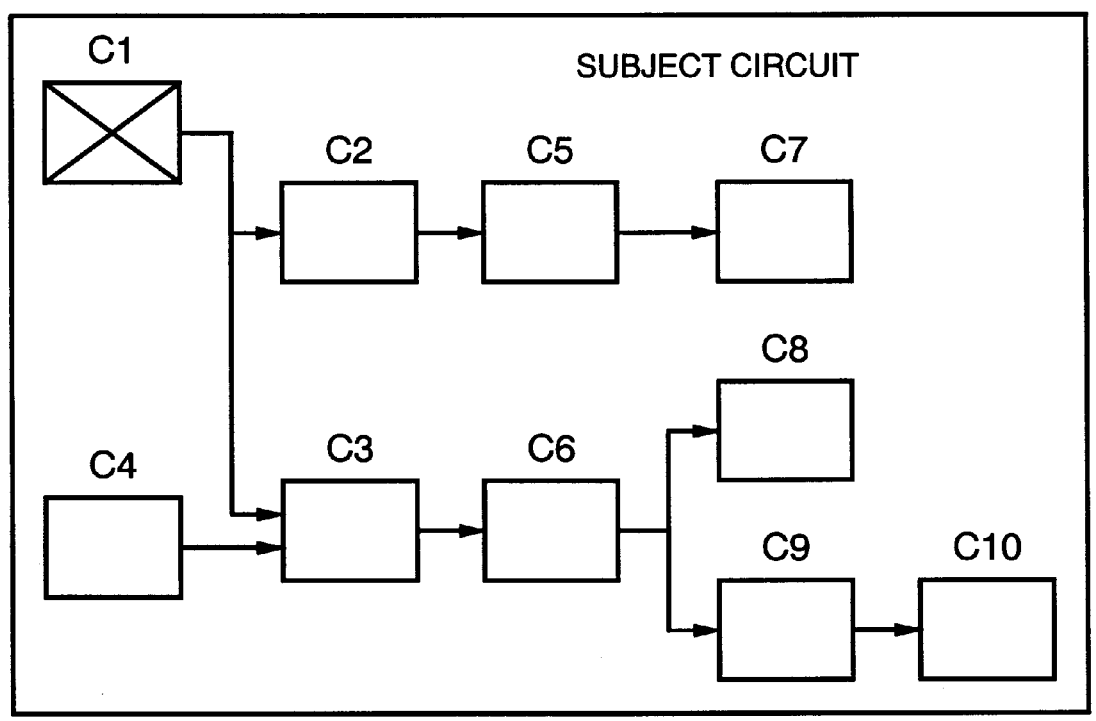
FIG. 5 is a diagram showing the subject circuit in a relation of clusters connected.
Figure 6A:
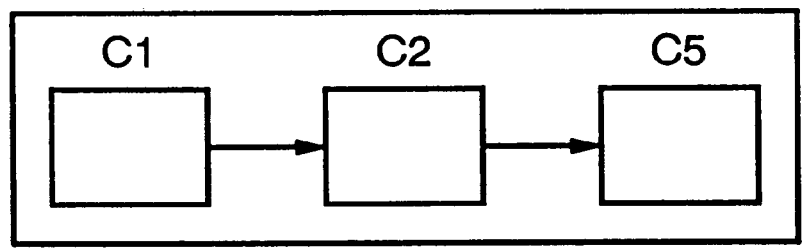
FIGS. 6A–6D are diagrams showing candidates for cells corresponding to the subject circuit shown in FIG. 5.
Figure 6B:
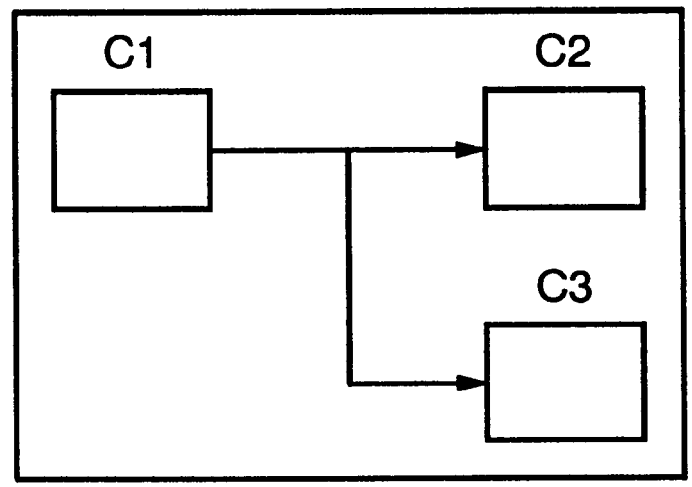
Figure 6C:
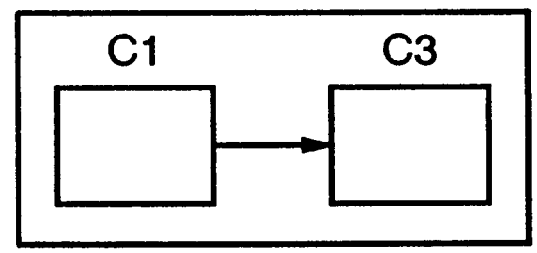
Figure 6D:
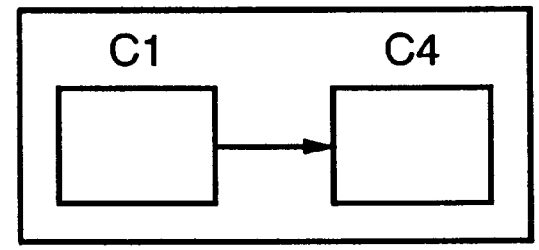
Figure 7:
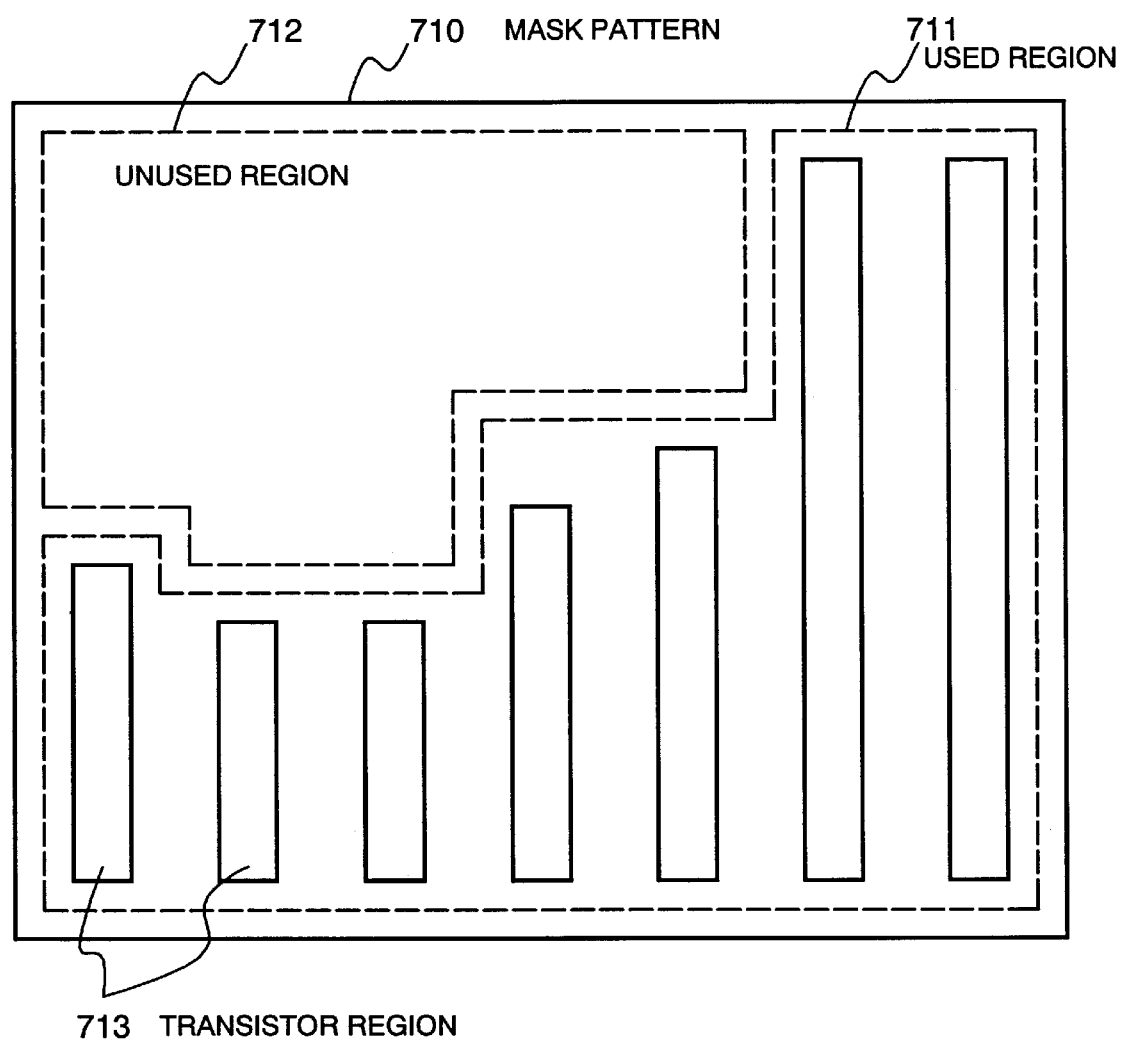
FIG. 7 is a layout diagram illustrating a conventional layout method, showing a state that transistors are arranged one-dimensionally.
Figure 8:
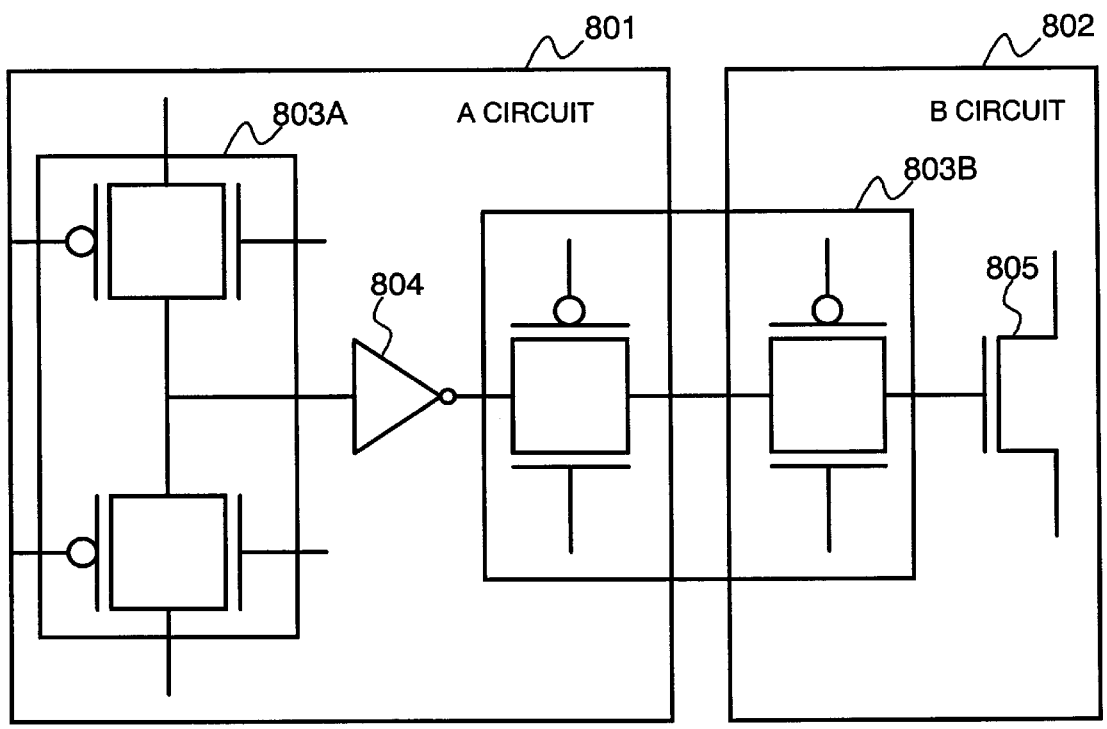
FIG. 8 is a circuit diagram illustrating a layout method using a cell library.

FIG. 5 shows the subject circuit in a state of clusters mutually connected, and FIG. 6 shows the cell pattern in a state of clusters mutually connected. In these drawings, the clusters having the same transistor structure have the same cluster number. The subject circuit 50 shown in FIG. 5 consists of ten clusters C1 to C10. Four cell patterns shown in FIG. 6 are examples of cell patterns containing the cluster C1.

A search start cluster of the subject circuit is recognized (step 203). The search start cluster is a cluster which is an initial reference to extract a small block to be collated with cells; for example, a cluster connected to an external input terminal of a device is selected.

Then, a start cluster is fetched from the clusters of the subject circuit stored in the storage region and stored on a working array (step 204). The start cluster is a cluster which becomes a reference to extract the small block to be collated with a cell. Initially, a search start cluster is determined as the start cluster. And, after extracting a small block by postprocessing, another cluster connected to the extracted small block is determined as the start cluster. The working array is an array which is a candidate for clusters which configure the small block to be collated with the cell. In the postprocessing, another cluster to be connected to the start cluster which was stored in step 204 is additionally stored in the working array. If there is no cluster to be extracted in step 204, the layout processing is terminated (step 205).

On the other hand, if there is a start cluster, the working array containing the pertinent start cluster is collated with the cells to extract a small block which forms the pertinent subject circuit (step 206). Specifically, a cell pattern which matches the connection relation of the clusters in the pertinent working array having the start cluster as the starting point is selected from the cell divided into clusters, the cell having the largest number of clusters among the selected cells is selected as a cell conforming with a small block which forms the pertinent subject circuit. The determination of the connection relation of the clusters is made by comparing the connection relation from the head pointer to the end pointer with the cell patterns with the noticed cluster determined as the head pointer and the end cluster in the pertinent working array as the end pointer among the clusters stored in the working array. The process of collating the working array with the cells will be described with reference of the flowchart of FIG. 3.

Figure 2:
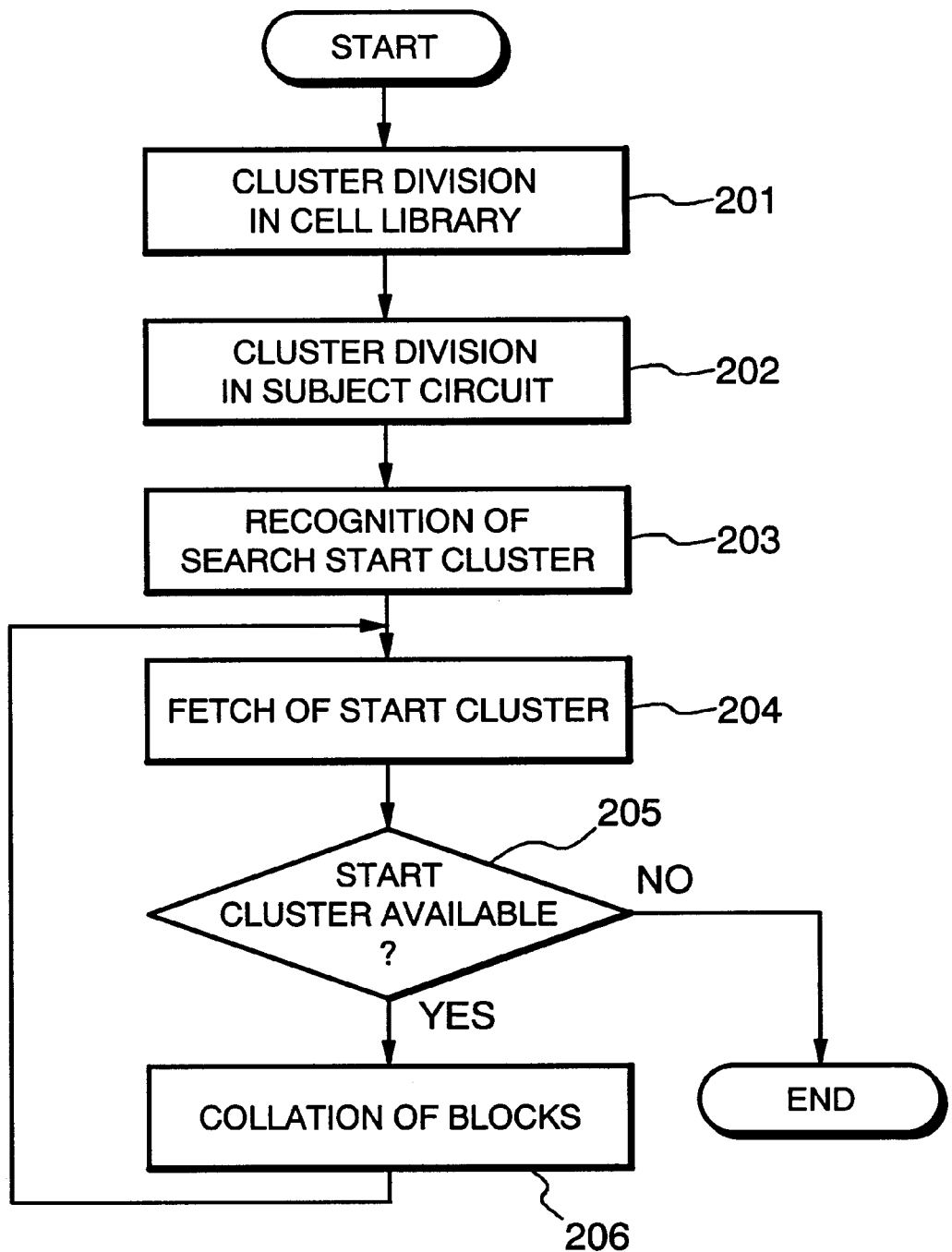
FIG. 2 is a flowchart showing an operation of the layout apparatus of the same embodiment.

The start cluster fetched in step 204 of FIG. 2 is stored in the working array (step 301). All cells having a cluster which is the same as the start cluster and has a start flag are selected from the cell library 30 (step 302). The cluster having a start flag is a cluster positioned at the start point in the pertinent cell, and corresponds to the start cluster in the working array. This start flag is added to the cluster to distinguish it from other cells containing the start flag.

Then, the connection relation between the start cluster in the subject circuit and another cluster is collated with the connection relation between the cluster having the start flag in the cell selected in step 302 and another cluster. And, among other clusters to be connected to the start cluster, a cluster which matches the connection relation in any cells is additionally stored in the working array (step 303).

The head pointer is advanced by one, and a cluster next to the start cluster is determined as the head pointer (step 304), and it is judged whether the head pointer has matched the end pointer (step 305). When the head pointer matches the end pointer, the cell having the largest number of clusters among the cells selected in step 302 is selected as a cell conforming with the small block which forms the subject circuit (step 307). If the head pointer does not match the end pointer, it is judged whether all clusters of the subject circuit were collated for the connection relation (step 306).

And, if there is any cluster which has not been collated, the process returns to step 303, the cluster which is the head pointer is collated for the connection relation between the pertinent cluster and other clusters and the connection relation between the cluster having the start flag in the cell selected in step 302 and other clusters. And, among other clusters to be connected to the start cluster, a cluster conforming with the connection relation in any cells is additionally stored in the working array. Then, the same process is repeated until collation is completed on all clusters (step 306).

When all clusters have been collated, the cell having the largest number of clusters among the cells selected in step 302 is selected as a cell which conforms with the small block which forms the subject circuit (step 307).

Generally, the subject circuit has clusters more than those of the cells stored in the cell library 30. Therefore, the selection of a cell performed only one time selects merely a cell (small block) having a matching pattern from the library with respect to the part formed of the cluster connected to the first cluster in the subject circuit. Then, with the cluster connected to the output of the pertinent cell in the subject circuit determined as the next start cluster, the process returns to step 204 shown in FIG. 2, and the cell selection described with reference to FIG. 3 is repeated. Thus, there are obtained the results of dividing the subject circuit by the cell having the largest number of clusters among the cells stored in the cell library 30.

Figure 3:
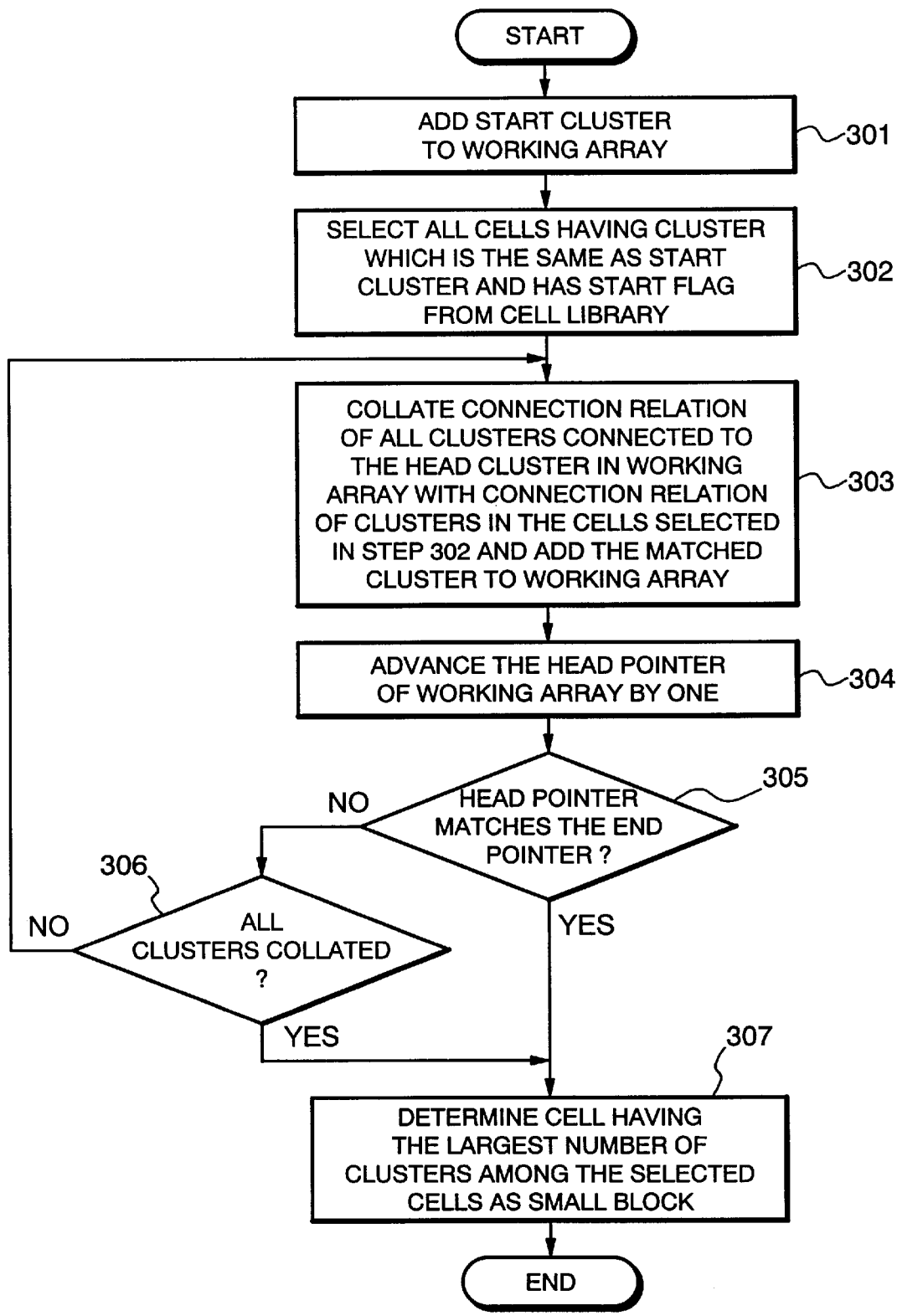
FIG. 3 is a flowchart showing a collating process in the circuit block shown in FIG. 2.

In the process of step 303 and downward shown in FIG. 3, if the storage region for storing the working array is fully occupied in the middle of tracing the connection relation of a cluster, the group division based on the connection relation of the cluster is paused at that point, and the pertinent cluster is determined as a division point. And, processing in the subject circuit is continued with a cluster connected to the output of the cluster determined as the division point as the next start cluster.

As described above, the layout apparatus and its method according to the invention examine the clusters one by one to select a conforming cell, so that flexibility of a circuit block which can be defined as the cell library is enhanced. Therefore, the subject circuit can be formed by combining appropriate circuit blocks having a small unused region in a semiconductor integrated circuit (LSI). Thus, it is effective to achieve further integration of a semiconductor integrated circuit.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A layout apparatus for making a layout of a semiconductor integrated circuit with the semiconductor integrated circuit indicated by clusters collated with cells stored in a cell library, comprising:

cluster dividing means for dividing the semiconductor integrated circuit into clusters;

cell selecting means for collating a connection relation of the clusters obtained by the cluster dividing means with a connection relation of the clusters in the cells stored in the cell library to select a cell with which the connection relation of clusters conform as circuit blocks to form the semiconductor integrated circuit, and for combining the circuit blocks to make layout of the semiconductor integrated circuit.

2. The layout apparatus as set forth in claim 1, wherein said cell selecting means, collates sequentially the connection relation of the clusters in the semiconductor integrated circuit with the connection relation of the clusters in the cells stored in the cell library to judge identity, and among the clusters forming the semiconductor integrated circuit, determines a cluster having specific conditions or a cluster connected to the output of the collated circuit block as a search start cluster, selects all cells containing the same cluster as the search start cluster from the cell library, selects cells containing the cluster connected to the output of the search start cluster from the selected cells, selects cells having the connection relation of clusters conforming with the connection relation of clusters in the semiconductor integrated circuit from the selected cells, and extracts a cell having the largest number of clusters from the selected cells as the circuit block forming the semiconductor integrated circuit, and makes a layout of the semiconductor integrated circuit by combining the obtained circuit blocks by repeating the process on all clusters of the semiconductor integrated circuit.

3. The layout apparatus as set forth in claim 1, wherein said cluster dividing means divides the semiconductor integrated circuit with the clusters formed of a group of transistors having mutually connected sources or drains determined as a unit.

4. The layout apparatus as set forth in claim 1, wherein said cluster dividing means divides the semiconductor integrated circuit with the clusters formed of a group of transistors having mutually connected sources or drains determined as a unit, and said cell selecting means, collates sequentially the connection relation of the clusters in the semiconductor integrated circuit with the connection relation of the clusters in the cells stored in the cell library to judge identity, and among the clusters forming the semiconductor integrated circuit, determines a cluster having specific conditions or a cluster connected to the output of the collated circuit block as a search start cluster, selects all cells containing the same cluster as the search start cluster from the cell library, selects cells containing the cluster connected to the output of the search start cluster from the selected cells, selects cells having the connection relation of clusters conforming with the connection relation of clusters in the semiconductor integrated circuit from the selected cells, and extracts a cell having the largest number of clusters from the selected cells as the circuit block forming the semiconductor integrated circuit, and makes a layout of the semiconductor integrated circuit by combining the obtained circuit blocks by repeating the process on all clusters of the semiconductor integrated circuit.

5. A layout method for making a layout of a semiconductor integrated circuit by collating the semiconductor indicated by clusters with cells stored in a cell library, comprising the steps of:

dividing the semiconductor integrated circuit into clusters;

collating sequentially a connection relation of the clusters in the semiconductor integrated circuit with a connection relation of the clusters in the cells stored in the cell library to judge identity, and among the clusters forming the semiconductor integrated circuit, determining a cluster having specific conditions or a cluster connected to the output of the collated circuit block as a search start cluster;

selecting all cells containing the same cluster as the search start cluster determined by the search start cluster decision step from the cell library;

selecting cells containing the cluster connected to the output of the search start cluster from the cells selected in the first cell selecting step;

selecting cells having the connection relation of clusters conforming with the connection relation of clusters in the semiconductor integrated circuit from the cells selected in the second cell selecting step, and extracting a cell having the largest number of clusters from the selected cells as the circuit block forming the semiconductor integrated circuit; and making a layout of the semiconductor integrated circuit by combining the obtained circuit blocks by repeating from the search start cluster decision step to the circuit block extraction step on all clusters of the semiconductor integrated circuit.

6. The layout method as set forth in claim 5, wherein said cluster dividing step divides the semiconductor integrated circuit with the clusters formed of a group of transistors having mutually connected sources or drains determined as a unit.

7. A computer readable memory having a computer program for controlling a layout apparatus which makes a layout of a semiconductor integrated circuit by collating the semiconductor integrated circuit indicated by clusters with cells stored in a cell library, said computer program comprising the steps of:

dividing the semiconductor integrated circuit into clusters;

collating sequentially a connection relation of the clusters in the semiconductor integrated circuit with a connection relation of the clusters in the cells stored in the cell library to judge identity, and among the clusters forming the semiconductor integrated circuit, determining a cluster having specific conditions or a cluster connected to the output of the collated circuit block as a search start cluster;

selecting all cells containing the same cluster as the search start cluster determined by the search start cluster decision step from the cell library;

selecting cells containing the cluster connected to the output of the search start cluster from the cells selected in the first cell selecting step;

selecting cells having the connection relation of clusters conforming with the connection relation of clusters in the semiconductor integrated circuit from the cells selected in the second cell selecting step, and extracting a cell having the largest number of clusters from the selected cells as the circuit block forming the semiconductor integrated circuit; and making a layout of the semiconductor integrated circuit by combining the obtained circuit blocks by repeating from the search start cluster decision step to the circuit block extraction step on all clusters of the semiconductor integrated circuit.

8. The computer readable memory as set forth in claim 7, wherein said cluster dividing step of the computer program divides the semiconductor integrated circuit with the clusters formed of a group of transistors having mutually connected sources or drains determined as a unit.

* * * * *